(12) United States Patent
Choi

(10) Patent No.: US 7,687,392 B2
(45) Date of Patent: Mar. 30, 2010

(54) SEMICONDUCTOR DEVICE HAVING METAL WIRING AND METHOD FOR FABRICATING THE SAME

(75) Inventor: Chee Hong Choi, Seoul (KR)

(73) Assignee: Dongbu Hitek Co., Ltd., Seoul (KR)

( * ) Notice: Subject to any disclaimer, the term of this patent is extended or adjusted under 35 U.S.C. 154(b) by 170 days.

(21) Appl. No.: 11/980,649

(22) Filed: Oct. 31, 2007

(65) Prior Publication Data

US 2008/0157379 A1 Jul. 3, 2008

(30) Foreign Application Priority Data

Dec. 28, 2006 (KR) ...................... 10-2006-0135905

(51) Int. Cl.
*H01L 21/283* (2006.01)
(52) U.S. Cl. ................. 438/624; 257/E21.159
(58) Field of Classification Search .......... 438/533, 438/624, 639, 643
See application file for complete search history.

(56) References Cited

U.S. PATENT DOCUMENTS 6,911,382 B2 * 6/2005 Jung et al. ................ 438/533

\* cited by examiner

*Primary Examiner*—W. David Coleman
*Assistant Examiner*—Daniel Shook
(74) *Attorney, Agent, or Firm*—Finnegan, Henderson, Farabow, Garrett, & Dunner, L.L.P.

(57) ABSTRACT

A method for fabricating a semiconductor device having a metal wiring is provided. The method includes: forming an inter-metal dielectric (IMD) layer on the semiconductor substrate having a first metal wiring formed therein, the IMD layer including a first IMD layer and a second IMD layer; forming a via hole in the IMD layer to expose the first metal wiring; forming an ion barrier layer on sidewalls of the via hole; forming a diffusion barrier layer on the semiconductor substrate, on which the ion barrier layer has been formed; forming a metal layer on the semiconductor substrate in the via hole; and forming a second metal wiring on the semiconductor substrate, the second metal wiring contacting the metal layer in the via hole.

7 Claims, 3 Drawing Sheets

SEMICONDUCTOR DEVICE HAVING METAL WIRING AND METHOD FOR FABRICATING THE SAME

This application claims the benefit of priority to Korean Patent Application No. 10-2006-0135905, filed on Dec. 28, 2006, the entire contents of which are incorporated herewith by reference.

BACKGROUND

1. Technical Field

The present invention relates, in general, to a semiconductor device and a method for fabricating the semiconductor, and more particularly, to a semiconductor device having a metal wiring and a method for fabricating the semiconductor device.

2. Related Art

Advances in the fabrication technology of semiconductor devices require higher degrees of integration and performance of the semiconductor devices. For those semiconductor devices having metal wirings, to fulfill these requirements, a single inter-metal dielectric (IMD) layer having a low dielectric constant, such as fluorinated silicate glass (FSG) layer, is often used. The FSG layer may comprise silicon oxide, on which fluorine (F) is doped.

If the FSG layer is used as the IMD layer, RC delay of the semiconductor device may be reduced, because the capacitance of a lower metal wiring and an upper metal wiring can be lowered.

However, although the FSG layer has a low dielectric constant, fluorine (F) frequently diffuses into neighboring films. Further, the FSG layer has an adverse effect on the adhesion between a metal layer and the FSG layer, and between metal layers. As a result, electrical characteristics of the semiconductor device may be degraded.

SUMMARY

Embodiments consistent with the present invention provide a semiconductor device having a metal wiring and a method for fabricating the semiconductor device. Electrical characteristics of the thus fabricated semiconductor device can be improved.

In accordance with an aspect consistent with the present invention, there is provided a method for fabricating a semiconductor device, comprising: forming a first metal wiring in a semiconductor substrate; forming an inter-metal dielectric (IMD) layer on the semiconductor substrate having the first metal wiring formed therein, the IMD layer including a first IMD layer and a second IMD layer; forming a via hole in the IMD layer to expose the first metal wiring; forming an ion barrier layer on the semiconductor substrate having the IMD layer formed thereon, in which the via hole has been formed; performing a break through (BT) process to the ion barrier layer, such that the ion barrier layer remains only on sidewalls of the via hole; forming a diffusion barrier layer on the semiconductor substrate, on which the ion barrier layer has been formed and the BT process has been performed; forming a metal layer on the semiconductor substrate, on which the diffusion barrier layer has been formed; polishing the top surface of the semiconductor substrate until the IMD layer is exposed, such that the metal layer only remains in the via hole; and forming a second metal wiring on the semiconductor substrate, the second metal wiring contacting the metal layer remained in the via hole.

In accordance with another aspect consistent with the present invention, there is provided a semiconductor device, a semiconductor substrate; a first metal wiring formed in the semiconductor substrate; an inter-metal dielectric (IMD) layer formed on the semiconductor substrate, the IMD layer having a via hole exposing a portion of the first metal wiring; an ion barrier layer formed on sidewalls of the via hole; a diffusion barrier layer, formed between the first metal wiring and the gap-filled metal, and between the ion barrier layer and the gap-filled metal; a gap-filled metal layer formed in the via hole; and a second metal wiring formed on the inter-metal dielectric layer, the second metal wiring contacting the gap-filled metal layer.

BRIEF DESCRIPTION OF THE DRAWINGS

The above and other features consistent with the present invention will become apparent from the following description of specific embodiments given in conjunction with the accompanying drawings, in which.

DETAILED DESCRIPTION

Hereinafter, embodiments consistent with the present invention will be described in detail with reference to the accompanying drawings, so that they can be readily implemented by those skilled in the art.

FIGS. 1 to 5 are cross-sectional views illustrating a method for fabricating a metal wiring of a semiconductor device in accordance with embodiments consistent with the present invention.

Figure 1:
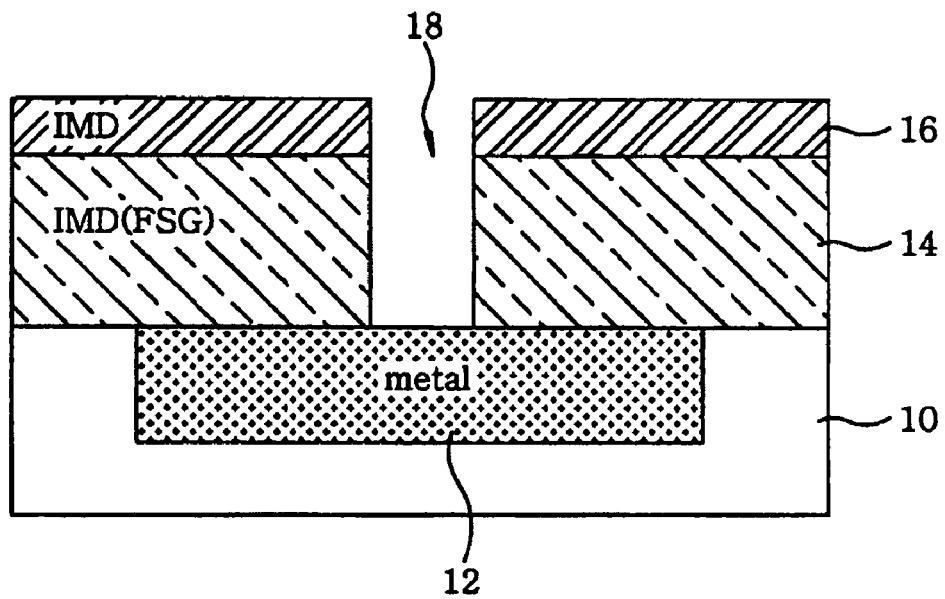
FIGS. 1 to 5 are cross-sectional views illustrating a method for fabricating a semiconductor device having a metal wiring, in accordance with embodiments consistent with the present invention.

Referring to FIG. 1, a lower metal wiring 12 is formed in a substrate 10, in which circuit elements (not shown) have been formed. A first inter-metal dielectric (IMD) layer 14 is formed on substrate 10 and a second IMD layer 16 is formed on first IMD layer 14. In one embodiment, first IMD layer 14 may comprise a fluorinated silicate glass (FSG) layer, that is, a silicon oxide layer on which fluorine (F) is doped. Second IMD layer 16 may comprise a silane ($SiH_4$) layer to prevent the diffusion of F distributed in the FSG layer. A via hole 18, through which lower metal wiring 12 may be exposed, is formed in first and second IMD layer 14 and 16.

Figure 2:
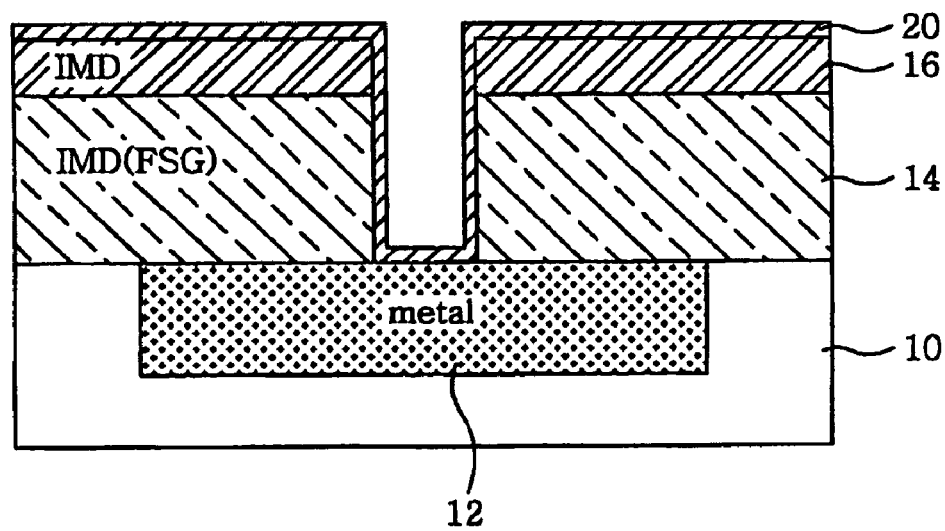

Referring to FIG. 2, an ion barrier layer 20 is formed on second IMD layer 16 and sidewalls of via hole 18 by using an atomic layer deposition (ALD) method. In one embodiment, ion barrier layer 20 may comprise $SiN_4$, which may be made of Hydrogen-rich (H-rich) $SiN_4$ with a good capture capability of F ions. In one embodiment, ion barrier layer 20 may be formed to have a thickness of about 50 angstrom to 100 angstrom by the ALD method. Other thicknesses may also be used.

Figure 3:
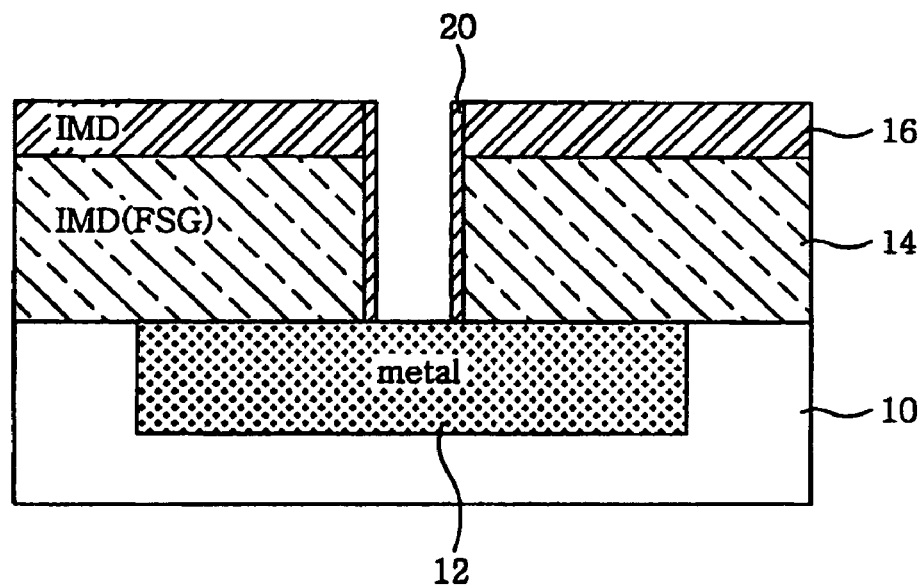

Referring to FIG. 3, a break through (BT) process is performed to substrate 10, on which ion barrier layer 20 has been formed, so that portions of ion barrier layer 20 formed at the bottom of via hole 18 and on the top surface of second IMD layer 16 are removed. Thus, ion barrier layer 20 remains only on the sidewalls of via hole 18. In one embodiment, the BT process may be a radio frequency (RF) treatment performed in a deposition chamber for forming a diffusion barrier layer to be discussed below.

Figure 4:
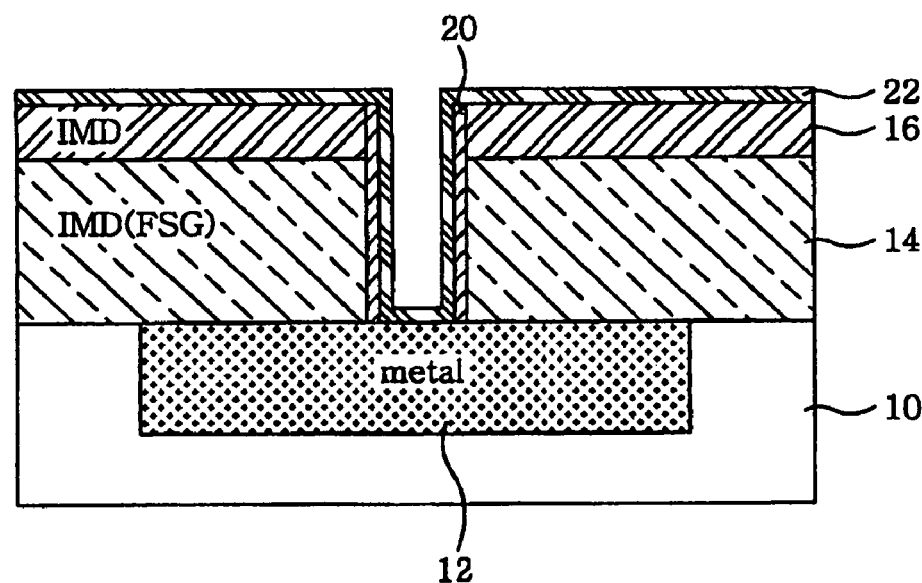

Referring to FIG. 4, a diffusion barrier layer 22 is formed on substrate 10, on which ion barrier layer 20 has been formed on the sidewalls of via hole 18. In other words, diffusion barrier layer 22 is formed on second IMD layer 16, on ion barrier layer 20 on the sidewalls of via hole 18, and on the exposed portion of lower metal wiring 12.

Figure 5:
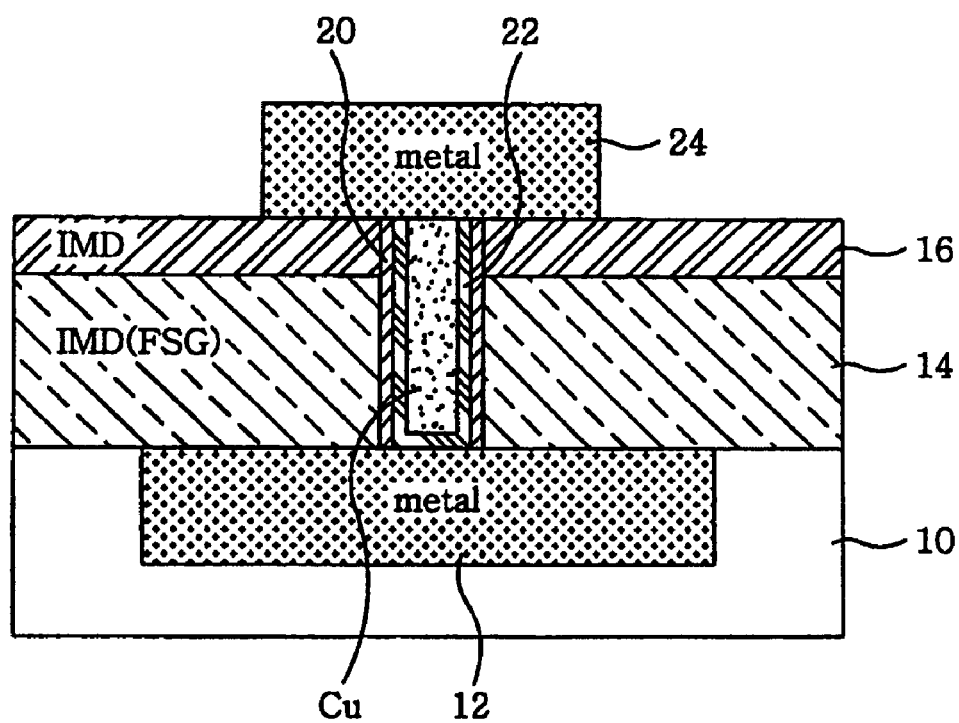

Referring to FIG. 5, a metal layer, such as copper (Cu), is formed on substrate 10, on which diffusion barrier layer 22 has been formed. Then, a polishing process, such as chemical mechanical polishing (CMP), may be performed until second IMD layer 16 is exposed. Thus, the metal layer is gap-filled only within via hole 18. After that, an upper metal wiring 24 is formed on second IMD layer 16 contacting the metal layer. Upper metal wiring 24 and lower metal wiring 12 may comprise a metal, such as tungsten.

As described above, ion barrier layer 20 is formed on the sidewalls of via hole 18, and second IMD layer 16 is formed at the top portion of via hole 18. Thus, the diffusion of F from first IMD layer 14 made of an FSG layer can be prevented. As a result, the adhesion between metal and FSG layers, and the adhesion between metal layers can be improved.

While the present invention has been described with respect to specific embodiments, it will be understood by those skilled in the art that various changes and modifications may be made without departing from the scope consistent with the present invention as defined in the following claims.

What is claimed is:

1. A method for fabricating a semiconductor device, comprising:

forming a first metal wiring in a semiconductor substrate;

forming an inter-metal dielectric (IMD) layer on the semiconductor substrate having the first metal wiring formed therein, the IMD layer including a first IMD layer and a second IMD layer;

forming a via hole in the IMD layer to expose the first metal wiring;

forming an ion barrier layer on the semiconductor substrate having the IMD layer formed thereon, in which the via hole has been formed;

performing a break through (BT) process to the ion barrier layer, such that the ion barrier layer remains only on sidewalls of the via hole;

forming a diffusion barrier layer on the semiconductor substrate, on which the ion barrier layer has been formed and the BT process has been performed;

forming a metal layer on the semiconductor substrate, on which the diffusion barrier layer has been formed;

polishing the top surface of the semiconductor substrate until the IMD layer is exposed, such that the metal layer only remains in the via hole; and forming a second metal wiring on the semiconductor substrate, the second metal wiring contacting the metal layer remained in the via hole.

2. The method of claim 1, wherein the ion barrier layer comprises a hydrogen-rich (H-rich) $SiN_4$ layer.

3. The method of claim 1, wherein the BT process includes an RF treatment performed in a deposition chamber for forming the diffusion barrier layer.

4. The method of claim 1, wherein the first and the second metal wiring include tungsten.

5. The method of claim 1, wherein the inter-metal dielectric layer comprises a fluorinated silicate glass (FSG) layer and a silane ($SiH_4$) layer.

6. The method of claim 1, wherein the metal layer comprises copper.

7. The method of claim 2, wherein the H-rich $SiN_4$ layer is formed to have a thickness of about 50 angstrom to 100 angstrom using an atomic layer deposition (ALD) method.

* * * * *